US006864182B2

United States Patent
Butschke et al.

(10) Patent No.: US 6,864,182 B2
(45) Date of Patent: Mar. 8, 2005

(54) METHOD OF PRODUCING LARGE-AREA MEMBRANE MASKS BY DRY ETCHING

(75) Inventors: Jörg Butschke, Stuttgart (DE); Albrecht Ehrmann, Krailling (DE); Karl Kragler, Erlangen (DE); Florian Letzkus, Tübingen (DE); Christian Reuter, Unter Teck (DE); Reinhard Springer, Sulz (DE)

(73) Assignee: Infineon Technologies AG, Munich (DE)

( * ) Notice: Subject to any disclaimer, the term of this patent is extended or adjusted under 35 U.S.C. 154(b) by 337 days.

(21) Appl. No.: 10/185,631

(22) Filed: Jun. 28, 2002

(65) Prior Publication Data

US 2003/0003739 A1 Jan. 2, 2003

(30) Foreign Application Priority Data

Jun. 28, 2001 (DE) .......................................... 101 31 139

(51) Int. Cl.[7] ............................................ H01L 21/302
(52) U.S. Cl. ....................... 438/706; 738/735; 738/928; 738/942; 216/67
(58) Field of Search ................................ 438/706, 735, 438/928, 942, 976; 216/67

(56) References Cited

U.S. PATENT DOCUMENTS

| | | | | |
|---|---|---|---|---|
| 5,899,728 A | * | 5/1999 | Mangat et al. | 438/459 |
| 5,972,794 A | * | 10/1999 | Katakura | 438/704 |
| 6,124,063 A | * | 9/2000 | Dauksher et al. | 430/5 |
| 6,140,020 A | * | 10/2000 | Cummings | 430/296 |
| 6,555,297 B1 | * | 4/2003 | Lercel | 430/313 |

FOREIGN PATENT DOCUMENTS

WO    WO 99/49365    9/1999

* cited by examiner

*Primary Examiner*—Nadine G. Norton
*Assistant Examiner*—Lynette T. Umez-Eronini
(74) *Attorney, Agent, or Firm*—Laurence A. Greenberg; Werner H. Stemer; Gregory L. Mayback

(57) ABSTRACT

Based upon an existing or to be produced multi-layered semiconductor-insulator-semiconductor carrier layer wafer (SOI substrate), irregularity of the etching conditions between the center and the edge region occurring during dry etching can be counteracted by a number of alternative steps, in particular, an additional layer construction compensating for the etching irregularity so that in any event an approximately homogeneous etching removal takes place over the entire area of the wafer to be etched.

14 Claims, 4 Drawing Sheets

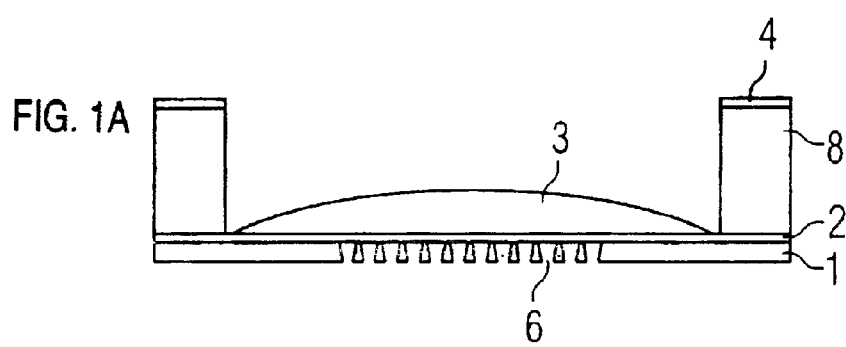
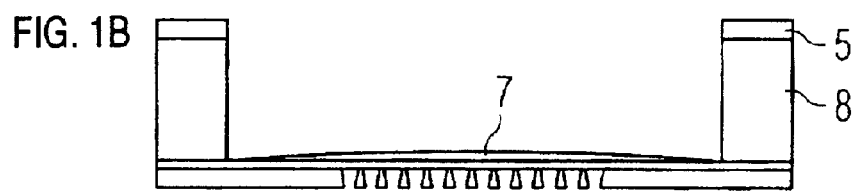

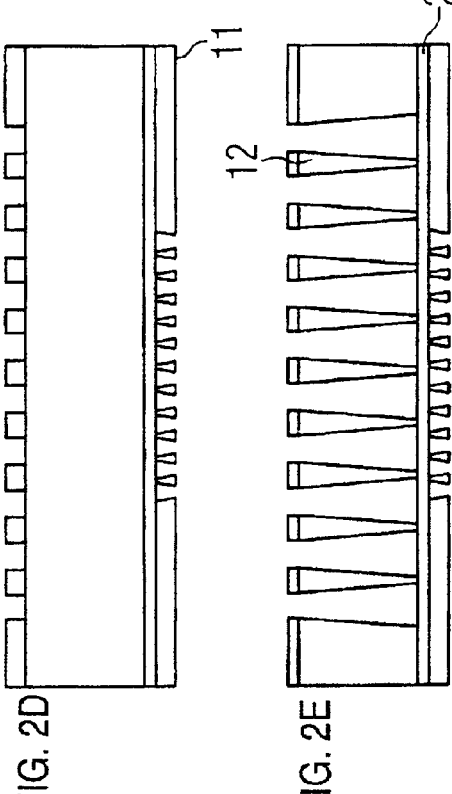
FIG. 2A
FIG. 2B
FIG. 2C
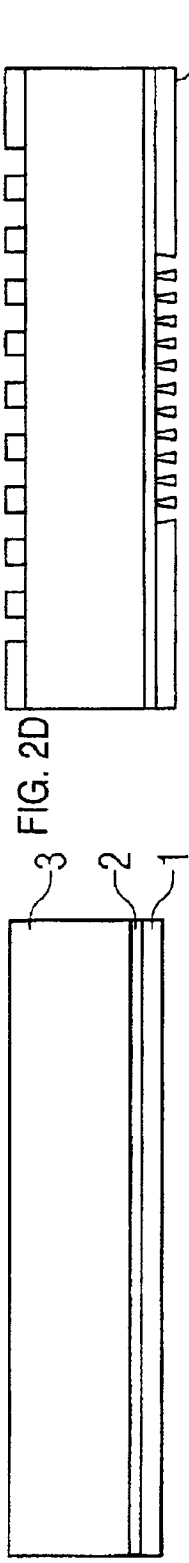
FIG. 2D
FIG. 2E
FIG. 2F

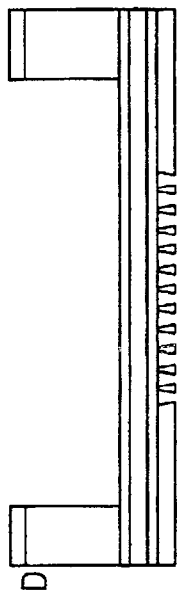
FIG. 3A
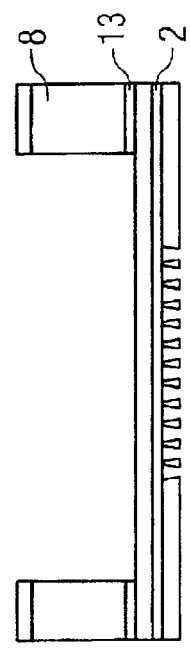
FIG. 3B
FIG. 3C
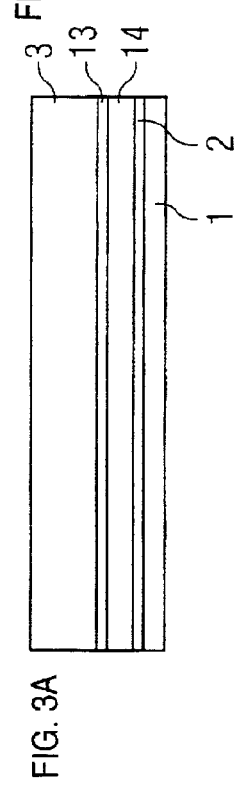
FIG. 3D
FIG. 3E
FIG. 3F
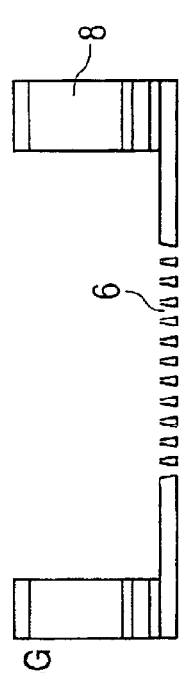
FIG. 3G

METHOD OF PRODUCING LARGE-AREA MEMBRANE MASKS BY DRY ETCHING

BACKGROUND OF THE INVENTION

Field of the Invention

The invention relates to a method of producing a large-area membrane mask based upon an existing or to be produced multi-layered semiconductor—insulator—semiconductor carrier layer wafer (SOI substrate), in which, firstly, the semiconductor layer is structured by the forming of mask openings and, subsequently, the SOI substrate underneath the mask openings is removed from its rear side by at least one dry-etching step, so that a membrane formed by the structured semiconductor layer and held by a carrying ring is produced.

Such a dry-etching method in the SOI wafer flow process is already disclosed in International Application WO 99/49365.

In semiconductor technology, the structuring of the silicon wafer is today performed almost exclusively with the aid of the lithographic technique, in which a resist pattern is firstly produced on the wafer in a radiation-sensitive resist layer and then serves as a mask in a following process step, for example, etching. Thereafter, the resist mask is removed again. The resist pattern itself is likewise produced with the aid of a mask suitable for the respective exposure method. In conventional photolithography, chromium masks (reticles) that include a glass plate as the carrier and a thin structured chromium layer are used. Even when weakly absorbent materials such as silicon are used, masks for X-ray lithography allow only mask carrier thicknesses in the micrometer range. This is accomplished by membrane masks that have a central active region, in which they are thinned with respect to the membrane, and a supporting edge (carrying ring) in the original thickness of the silicon substrate. In the case of X-ray masks, a geometrically structured absorber layer is provided on the membrane layer.

In the case of electron and ion lithography, membrane masks in which the mask openings are not produced on the membrane layer but in it have to be used. The membrane layer, the thickness of which lies in the micrometer range, contains mask openings or holes in a way corresponding to the figures to be lithographically produced. Consequently, as in the case of all membrane masks, such aperture masks (stencil masks), as they are referred, are mechanically comparatively unstable formations.

For electron and ion projection lithography and also for newer versions of X-ray lithography, membrane masks with thicknesses in the micrometer range and with membrane areas of up to over 100 cm² in size have to be produced. The membrane masks produced by the method according to the invention can be used in general for lithography methods with charged particles and with photons. An example is use in the case of 13 nm lithography (soft X-rays). Similarly, use for masking with respect to neutral particles (atom lithography) and in all applications as an evaporation mask is possible. Membrane masks as a product of a method according to the present invention can also be generally used for sensors.

Based upon silicon wafers as a substrate material, two different technological process variants are pursued for producing the membrane masks. They differ in principle according to whether the process steps for the mask structuring take place before (wafer flow process) or after (membrane flow process) the production of the membrane.

In the case of what is referred to as the wafer flow process, as presented, for example, in International Application WO 99/49365, the mask structures are firstly produced on a compact silicon wafer and the production of the membrane by etching the rear side of the substrate takes place at the end of the process. Such a process variant makes it possible, on one hand, to carry out the structuring processes for the mask structures on stable wafers, which can be better controlled in terms of the process. On the other hand, in the case of such a variant, there are also very high requirements on the membrane etching process because the structured membrane side has to be protected absolutely securely from an etching attack. Boron doping of the membrane layer has been conventionally provided as the etching stop technique, although this often does not provide precisely enough defined conditions. Recently, therefore, SOI (Silicon-on-Insulator) substrates have also been used, likewise described in International Application WO 99/49365. In this case, the buried oxide layer in the SOI wafer serves as the defined etching stop and the doping of the membrane layer can be chosen as desired based upon other aspects.

The problems underlying the invention are explained below based upon FIG. 1A, which represents the result of a membrane dry-etching process according to the prior art.

Previously, the replacement of the conventional wet-chemical etching methods by dry-etching processes in the critical membrane etching step in the production process was more a wish than a reality. Even in International Application WO 99/49365, only wet-etching methods are specifically discussed. The dry-etching methods have two fundamental advantages. On one hand, it is a process that is compatible with the common methods in the semiconductor industry. On the other hand, the etching rate in dry-etching processes is independent of the crystal orientation in the silicon.

Problematical in the dry etching of silicon areas of several square centimeters in size is, in particular, the fact that the silicon etching rate is inhomogeneous over the area to be etched. FIG. 1A shows a typical inhomogeneous etching profile. Based upon a semiconductor—insulator—semiconductor carrier layer substrate, the structure of the membrane, that is, the mask openings 6, was transferred into the uppermost semiconductor layer 1, which serves as the future membrane layer. In a further step, the semiconductor carrier layer 3 is to be removed from the underside as far as an outer ring 8 (protected by the masking layer 4), so that the semiconductor layer 1 resting on the carrying ring 8 represents the structured membrane by its exposed central region, clamped by the carrying ring 8. In general, however, there has previously been an inhomogeneous etching removal, as represented for example in FIG. 1A. In the case of FIG. 1A, the etching rate is lower in the center of the wafer than in the edge region. In the production of large-area membrane masks, this etching inhomogeneity means a long overetching time, in particular, for the transitional membrane/wafer region. This may lead to etching through of the insulator layer and, accordingly, to destruction of the semiconductor membrane layer.

Furthermore, in the case of silicon dry-etching processes there is a problem of a strong dependence of the silicon etching rate on the silicon area offered (degree of occupancy). Added to this is the clamping and handling of thin, large-area silicon wafers during and after the dry-etching process, which cannot be carried out by the previous methods (etching cell etc.).

SUMMARY OF THE INVENTION

It is accordingly an object of the invention to provide a method of producing large-area membrane masks by dry etching that overcomes the hereinafore-mentioned disadvantages of the heretofore-known devices and methods of this general type and that is improved with regard to the problems mentioned.

With the foregoing and other objects in view, there is provided, in accordance with the invention, a method for producing a large-area membrane mask based upon one of an existing and to be produced multi-layered semiconductor layer—insulator layer—semiconductor carrier layer wafer having a rear side, a center region, and an edge region, including the steps of structuring the semiconductor layer by forming mask openings, subsequently removing the wafer underneath the mask openings from the rear side by at least one dry-etching step to produce a membrane formed by the structured semiconductor layer and held by a carrying ring, and covering the wafer in a region of the carrying ring with a masking layer during the at least one dry etching step, thereby causing irregularity of etching conditions between the center region and the edge region of the etched portion of the wafer, and counteracting such irregularity by providing an approximately homogeneous etching removal over an entire area of the wafer to be etched by one of, for an existing wafer, providing an additional layer construction compensating for the etching irregularity to at least one of a masking region and an open area of the semiconductor carrier layer to be etched, for an existing wafer, moving a mechanical etching diaphragm in front of the semiconductor carrier layer to expose the edge region to etching attack for a shorter time than the center region, and, during a production of the wafer, providing at least two insulator etching stop layers one on top of the other and separated by an inner semiconductor carrier layer, the inner semiconductor carrier layer being thinner than the semiconductor carrier layer etched in a first partial etching step. Preferably, the wafer is an SOI substrate.

The method is based on the realization that the inhomogeneity in the silicon dry-etching processes is based on the fact that, due to different materials to be etched (silicon; oxide or resist as masking layer), different etching conditions exist in the edge region of the silicon wafer than in the center (in particular, lower consumption of etching media above the masking layer than in the center). This means a greater and quicker depletion of the reactive species in the center of the wafer and, consequently, a lower etching rate than in the edge region. The invention provides the stated alternative measures to compensate at least partially for the inhomogeneous neighboring conditions and, as a result, accomplish an approximately homogeneous etching removal. Furthermore, high etching rates and selectivities are achieved.

In accordance with another mode of the invention, the semiconductor carrier layer is a silicon carrier layer, and which further comprises applying a silicon ring, forming the additional layer construction and/or the masking layer and the additional layer construction, to the silicon carrier layer in the masking region, the silicon ring having a thickness that is sufficient to protect the silicon carrier layer in the masking region in spite of its own progressive etching removal.

Alternatively, in accordance with a further mode of the invention, it is possible for a masking pattern, reducing the degree of silicon occupancy of the semiconductor carrier layer, to be applied as an additional layer construction to the open area to be etched, so that, after a first dry-etching step, remains of the semiconductor carrier layer corresponding to the masking pattern initially remain.

In such a case, it is advantageous that, in a further etching step, the remains remaining after the first dry-etching process are removed together with the insulator stop layer by underetching. The masking pattern may be applied by depositing and subsequently structuring a masking layer or by attaching a prestructured masking, in particular, a film structured in a grid-like manner.

In accordance with an added mode of the invention, the masking pattern is applied by depositing and subsequently structuring a masking layer and/or attaching a prestructured masking.

In accordance with an additional mode of the invention, the prestructure masking is a film structured in a grid shape.

In accordance with yet another mode of the invention, a gray-scale mask is produced, and a mechanical etching diaphragm is used or an SOI substrate with at least two insulator etching stop layers is used.

In accordance with yet a further mode of the invention, a gray-scale mask is produced in the transitional masking region/open area region as an additional layer construction.

In accordance with yet an added mode of the invention, etching is performed utilizing a rotating etching diaphragm having a diaphragm opening formed larger in the center region than in the edge region.

In accordance with yet an additional mode of the invention, etching is performed utilizing a periodically opening and closing iris diaphragm.

In accordance with a concomitant mode of the invention, provides that, before the dry etching, the wafer structured on the front side is attached with the semiconductor layer on a handle wafer by wax or an adhesive film and that the wafer is separated again from the handle wafer after the membrane etching. This can be used in the case of all alternatives of the method of the invention.

Other features that are considered as characteristic for the invention are set forth in the appended claims.

Although the invention is illustrated and described herein as embodied in a method of producing large-area membrane masks by dry etching, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1A is a diagrammatic illustration of a typical inhomogeneous etching profile according to the prior art;

FIG. 1B is a diagrammatic illustration of a typical approximately homogeneous etching profile according to the invention;

FIGS. 2A to 2F are cross-sectional views of successive partial steps of a method according to the invention using a masking pattern;

FIGS. 3A to 3G are cross-sectional views of successive partial steps of an alternative method according to the invention using two etching stop layers.

DESCRIPTION OF THE PREFERRED EMBODIMENTS

Figure 4A:
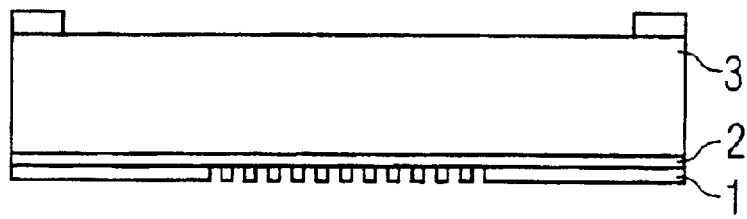
FIGS. 4A to 4D are cross-sectional views of successive partial steps of a preparation method according to the invention using a handle wafer.
Figure 4B:
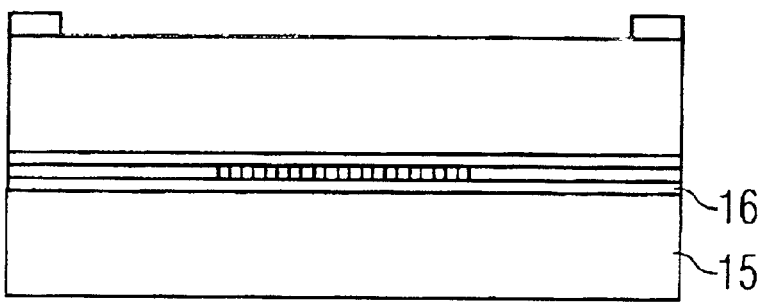
Figure 4C:
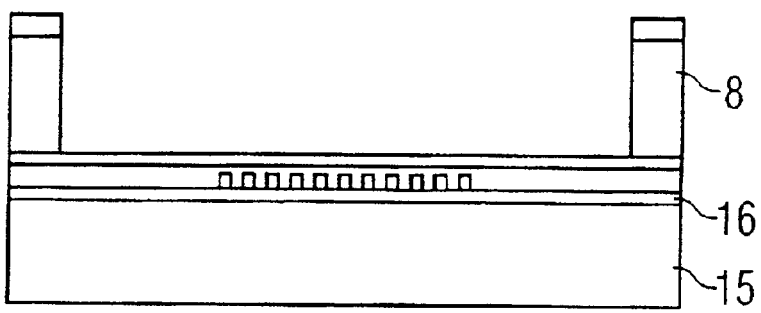
Figure 4D:
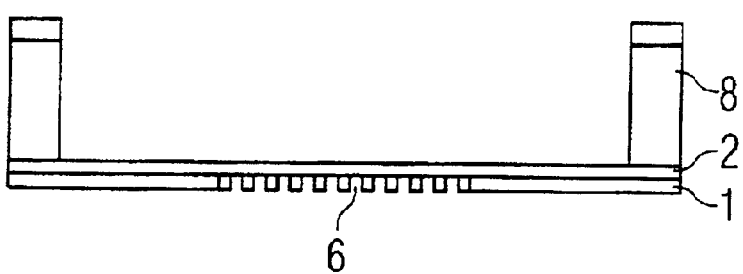

Referring now to the figures of the drawings in detail and first, particularly to FIG. 1B thereof, there is shown a configuration according to the invention. By applying a silicon ring 5 of silicon to the semiconductor carrier layer, and consequently offering silicon also in the edge region (masking region) of the wafer to be etched, it is possible to compensate largely for the depletion effect described above. The virtually homogeneous etching result (remains 7) is shown in FIG. 1B. The silicon ring 5, originally having approximately the thickness of the semiconductor carrier layer 3, was removed at the same time down to the remains shown. In addition, the size of the membrane is defined by the material-compensating silicon ring 5, leading to matching of the etching conditions in the transitional membrane/carrying ring region. As a result, the silicon ring 5 may either directly form the additional layer construction and at the same time the masking layer 4, or a traditional masking layer 4, for example, polymer, dielectric, or metal, may be located under the silicon ring 5.

FIGS. 2A to 2F, in particular, FIG. 2A shows as a starting point 2A an SOI substrate with a semiconductor carrier layer 3, a semiconductor layer 1 and with a buried insulator layer 2 in between. By suitable choice of a rear side pattern (masking pattern 9), the degree of silicon occupancy, that is the proportion of the open silicon area within the entire silicon rear side, the semiconductor carrier layer 3, is reduced and, as a result, the silicon etching rate is increased. At the same time, the problem of depletion of the reactive species in the center of the wafer is reduced and, consequently, the homogeneity of the etching is increased.

Partial step 2B shows the application of a masking pattern 9 with structures of the order of magnitude of 100 micrometers. Suitable as materials for a prestructured masking are a free dielectric film, a metal foil, a polymer film, or a combination of films/foils. However, with analogous materials, a masking layer can similarly be deposited and structured for the masking pattern 9. The masking pattern 9 effectively makes the open area to be etched match the conditions at the edge that is over the annular masking layer 4. Furthermore, a resist layer 10 for the mask openings 6 is applied and structured.

In the next partial step 2C, the (trench) etching of the mask openings 6 takes place in the semiconductor layer 1 and, subsequently, partial step 2D, the removal of the resist layer 10 and the depositing of a protective layer 11.

The masking and silicon remains 12 remaining after the membrane etching, partial step 2E, are underetched and removed in subsequent etching steps during removal of the etching stop layer 2. The semiconductor layer 1, supported by the carrying ring 8, then forms the structured membrane. After removal of the protective layer 11, the end state shown in FIG. 2F results.

With precise knowledge of the process parameters
homogeneity
etching rates
selectivity
of the dry-etching process, it is possible to expose into a photoresist in the transitional membrane/carrying ring region a thickness profile that corresponds to an inverse etching profile (gray-scale mask). As a result, it is possible to compensate exactly for the irregularity of the dry-etching process.

By rotation of a mechanical etching diaphragm with a specific pattern of openings in front of the semiconductor carrier layer 3, it is possible to achieve the effect in the etching system that the etching times are adapted to the respective etching rates such that a homogeneous etching removal takes place over the entire area. The edge region of the silicon wafer is exposed to the etching attack of the reactive species for a somewhat shorter time than the center. By adapting the diaphragm rotation speed and the degree of diaphragm opening, a very homogeneous etching removal can be achieved.

A homogeneous etching removal can likewise be achieved by periodically opening and closing a mechanical iris diaphragm, which is provided in front of the semiconductor carrier layer 3 in the etching system.

FIGS. 3A to 3G show a simplified process flow for the production of the mask, starting with silicon wafers with two buried etching stop layers. These can be produced in a conventional way, in particular, by implantation of oxygen. The SOI substrate with a lower etching stop layer 2 and an upper etching stop layer 13, which are separated by an inner semiconductor carrier layer 14, serves as a mask blank, cf. FIG. 3A. Such a construction makes it possible to compensate for etching inhomogeneities that occur during the removal of the membrane carrier layers because, although any inhomogeneities after the first partial dry-etching step, FIG. 3D, have been transferred into the upper, relatively thick etching stop layer 13, an inhomogeneity in the stop layer 13 does not present any problem because the stop layer 13 is removed by a highly selective wet-etching process, cf., FIGS. 3E and 3F.

The etching stop layers 2, 13 may be dielectric, metal layers or a combination of these.

To be able to use dry-etching processes for the production of membrane masks, a suitable preparation technique is needed, ensuring safe handling of the silicon wafers to be etched in the etching system during the etching process and nondestructive detachment of the thinned membrane wafer. By adhesively attaching the membrane layer, that is the front side of the SOI substrate, cf., FIG. 4A, onto a handle wafer with wax 16 or an adhesive film, the fragile stencil structures are mechanically protected and safe handling is ensured.

After the membrane etching, the membrane wafer 1, 2, 8 can be separated from the handle wafer 15 by dissolving the wax 16 or the adhesive film without leaving any residual remains. Such a preservational method ensures a high yield in such a critical process step.

We claim:
1. A method for producing a large-area membrane mask upon a multi-layered wafer having a semiconductor layer, a semiconductor carrier layer, a rear side, a center region, and an edge region, the method which comprises:

structuring the semiconductor layer by forming mask openings;

subsequently removing the wafer underneath the mask openings from the rear side by at least one dry-etching step to produce a membrane formed by the structured semiconductor layer and held by a carrying ring; and covering the wafer in a region of the carrying ring with a masking layer during the at least one dry etching step, thereby causing irregularity of etching conditions between the center region and the edge region of the etched portion of the wafer, and counteracting such irregularity by providing an approximately homogeneous etching removal over an entire area of the wafer to be etched by one of:

for an existing wafer, providing an additional layer construction compensating for the etching irregularity to at least one of a masking region and an open area of the semiconductor carrier layer to be etched;

for an existing wafer, moving a mechanical etching diaphragm in front of the semiconductor carrier layer to expose the edge region to etching attack for a shorter time than the center region; and during a production of the wafer, providing at least two insulator etching stop layers one on top of the other and separated by an inner semiconductor carrier layer, the inner semiconductor carrier layer being thinner than the semiconductor carrier layer etched in a first partial etching step.

2. The method according to claim 1, wherein the semiconductor carrier layer is a silicon carrier layer, and which further comprises applying a silicon ring, forming one of:
   the additional layer construction; and
   the masking layer and the additional layer construction,
to the silicon carrier layer in the masking region, the silicon ring having a thickness protecting the silicon carrier layer in the masking region even where the silicon ring is removed by progressive etching.

3. The method according to claim 1, wherein the semiconductor carrier layer is a silicon carrier layer, and which further comprises applying a silicon ring, forming one of the additional layer construction and the masking layer and the additional layer construction to the silicon carrier layer in the masking region, the silicon ring having a thickness protecting the silicon carrier layer in the masking region even where the silicon ring is removed by progressive etching.

4. The method according to claim 1, which further comprises applying a masking pattern, reducing a degree of silicon occupancy of the semiconductor carrier layer, as an additional layer construction to the open area to be etched, so that, after a first dry-etching step, remains of the semiconductor carrier layer corresponding to the masking pattern initially remain.

5. The method according to claim 4, wherein the insulator layer is an insulator stop layer, and which further comprises, removing the remains remaining after the first dry-etching process together with the insulator stop layer in a further etching step by underetching.

6. The method according to claim 4, which further comprises applying the masking pattern by one of:
   depositing and subsequently structuring a masking layer; and
   attaching a prestructured masking.

7. The method according to claim 6, wherein the prestructure masking is a film structured in a grid shape.

8. The method according to claim 5, which further comprises applying the masking pattern by one of:
   depositing and subsequently structuring a masking layer; and
   attaching a prestructured masking.

9. The method according to claim 8, wherein the prestructure masking is a film structured in a grid shape.

10. The method according to claim 1, which further comprises producing a gray-scale mask in a transitional masking region/open area region as an additional layer construction.

11. The method according to claim 1, which further comprises performing etching utilizing a rotating etching diaphragm having a diaphragm opening formed larger in the center region than in the edge region.

12. The method according to claim 1, which further comprises performing etching utilizing a periodically opening and closing iris diaphragm.

13. The method according to claim 1, wherein the wafer has a front side, and which further comprises:
   attaching the wafer structured on the front side with the semiconductor layer onto a handle wafer by one of wax and an adhesive film before the dry etching; and
   separating the wafer from the handle wafer after the membrane etching.

14. A method for producing a large-area membrane mask upon a wafer having a multi-layer configuration including a semiconductor-insulator-semiconductor carrier structure, a rear sided a center region, and an edge region, the method which comprises:
   structuring the semiconductor layer by forming mask openings;
   subsequently removing the wafer underneath the mask opening; from the rear side by at least one dry-etching step to produce a membrane formed by the structured semiconductor layer and held by a carrying ring; and
   covering the wafer in a region of the carrying ring with a masking layer during the at least one dry etching step, thereby causing irregularity of etching conditions between the center region and the edge region of the etched portion of the wafer, and counteracting such irregularity by providing an approximately homogeneous etching removal over an entire area of the wafer to be etched by one of:
      for an existing wafer, providing an additional layer construction compensating for the etching irregularity to at least one of a masking region and an open area of the semiconductor carrier layer to be etched;
      for an existing wafer, moving a mechanical etching diaphragm in front of the semiconductor carrier layer to expose the edge region to etching attack for a shorter time than the center region; and
      during a production of the wafer, providing at least two insulator etching stop layers one on top of the other and separated by an inner semiconductor carrier layer, the inner semiconductor carrier layer being thinner than the semiconductor carrier layer etched in a first partial etching step.

* * * * *